United States Patent [19]

Sutton

[11] Patent Number: 4,648,298
[45] Date of Patent: Mar. 10, 1987

[54] IN-LINE SHEARING DEVICE

[75] Inventor: David W. Sutton, Boulder, Colo.

[73] Assignee: Hero Automation, Boulder, Colo.

[21] Appl. No.: 735,843

[22] Filed: May 20, 1985

[51] Int. Cl.⁴ .................................................. B26D 1/08
[52] U.S. Cl. ................................................ 83/62; 83/387;
83/635; 83/694; 83/762; 83/824; 83/DIG. 1;
250/221; 269/545
[58] Field of Search ........................ 83/58, 62, 78, 762,
83/763, 783, 613, 617, 635, 639, 821, 824, 524,
694, 648, 387, 389, DIG. 1; 414/225; 340/679;
192/129 R; 250/221; 269/545, 50, 54.1; 100/53

[56] References Cited

U.S. PATENT DOCUMENTS

| 2,241,556 | 5/1941  | MacMillin et al. | 83/DIG. 1 |
| 2,626,664 | 1/1953  | Regele           | 83/588    |
| 2,963,627 | 12/1960 | Buchsbaum        | 192/130   |
| 3,064,512 | 11/1962 | Zurlo            | 83/694    |
| 3,771,401 | 11/1973 | Jasinski         | 83/453    |
| 3,834,213 | 9/1974  | Henzler et al.   | 72/405    |
| 3,908,496 | 9/1975  | Moelbert         | 83/617    |
| 3,933,065 | 1/1976  | Jano et al.      | 83/62     |
| 4,070,940 | 1/1978  | McDaniel et al.  | 83/464    |
| 4,309,696 | 1/1982  | Nagai et al.     | 340/515   |
| 4,309,928 | 1/1982  | Mitrzyk, Sr. et al. | 83/694 |

FOREIGN PATENT DOCUMENTS

| 2158182 | 5/1973  | Fed. Rep. of Germany. |        |
| 579578  | 10/1924 | France                | 83/639 |
| 1579020 | 11/1980 | United Kingdom.       |        |

Primary Examiner—Frank T. Yost
Assistant Examiner—Hien H. Phan
Attorney, Agent, or Firm—Robert C. Dorr

[57] ABSTRACT

A shearing device which uses an in-line design wherein bearings are aligned with the moving blade so that lever arm forces are not produced between the movable blade and a fixed blade. This provides for highly accurate and clean cuts of printed circuit boards. The fixed lower blade is vertically oriented to provide clearance on both front and back portions for placement of tooling means to hold printed circuit boards in the shear to minimize scrap cut from the boards. Additionally, the clearance provided by the vertically oriented lower blade allows for zero space cutting of the printed circuit boards adjacent components mounted on the printed circuit boards. An optical curtain is also used which is directly aligned with the movable upper blade so that obstructions can be detected directly in the path of movement of the upper blade. Microprocessor is also used to facilitate automation and provide operator prompts to operate tooling and change minor operational parameters, as well as providing safety operational features.

20 Claims, 13 Drawing Figures

IN-LINE SHEARING DEVICE

BACKGROUND OF THE INVENTION

1. Field of the Invention

The present invention pertains generally to shearing devices and more particularly to shearing devices for shearing printed circuit boards.

2. Discussion of the Background of the Invention

Shearing devices can be used in three separate applications in printed circuit board assembly lines including; (1) cutting panels from large printed circuit board sheet material, (2) trimming copper and epoxy flash on multi-layered panels, and (3) depaneling bare boards and printed circuit boards.

In prior art processes, large sheets of printed circuit board material, which are normally on the order of 42"×48" are sheared into smaller panels of approximately 18"×24". Of course, these dimensions may vary. Each of the panels contains a multiplicity of individual printed circuit boards of various shapes and sizes. The conductive paths of each of the printed circuit boards are etched on the boards in the larger panels. Each panel can accommodate various numbers of boards depending upon the size and the shape of the individual printed circuit boards. A routing device is then used to substantially separate the individual circuit boards from the larger panel. Tab portions are left between the individual circuit boards in the panel so that the individual boards can be maintained in a single structure for loading electrical components, soldering in a wave-soldering machine and testing the printed circuit boards after soldering. Individual boards can then be depaneled by manually breaking the tabs. Depaneling can occur either before or after loading of the electrical components and soldering.

The above described method of routing is the most common method of shaping individual printed circuit boards (otherwise known as profiling) and separating the individual printed circuit boards from each other and from scrap portions (otherwise known as depaneling). Routing techniques allow considerable flexibility in shaping the printed circuit boards and various configurations including arcs and curves which are not possible with other types of devices such as shears. However, routing is an extremely slow process which is noisy and produces a large amount of debris during cutting. Additionally, since the routing blade has a predetermined minimum diameter, a predetermined amount of waste is necessarily built into the layout of printed circuit boards on the panels to accommodate the router blade. Consequently, as the board sizes become smaller, the amount of waste increases because of the inability of routers to provide zero spacing between the boards. Moreover, loaded boards cannot be cut with a router because of vibration and stress produced by the routing process which causes solder joints to break. Also, the physical design of the router does not permit sufficient clearance to prevent interference between the router and components mounted on the boards. Also, routers are large, requiring additional floor space, and are expensive to acquire and maintain. Additionally, routers require a skilled operator and consume a large amount of energy to operate. Also, the routing blades must be replaced frequently because they become dull very easily when cutting the printed circuit board material.

An additional problem resulting from the use of routers to separate individual printed circuit boards from larger panels is the time required to break the tabs comprising the supporting structure. Manual separation of the boards by breaking the tabs comprises a labor intensive process. Automated methods of breaking the tabs to separate the boards do not currently exist. Even if such automated methods did exist, this would require another step in the production line which would necessitate additional capital expenditures, complicate the production line and impede the flow of product.

As indicated above, the individual printed circuit boards are loaded with electrical components after the boards have been routed and the tabs formed. The structure is then placed in a wave soldering machine to solder the components to the printed circuit boards. The tab portions must have sufficient rigidity to support the structure with the components loaded thereon to ensure proper electrical connections are made in the wave soldering machine. At the same time, the tab portion must be sufficiently small to allow easy separation of the individual circuit boards from the larger panel without causing any breakage of the board or excess material.

Small board size produces a practical limit to automatically mass producing boards on a panel. As the board dimensions become smaller the linear routing requirements become more extensive, exacerbating the problems of routing set forth above, as well as causing other problems along the assembly line such as premature separation and wave solder overflow. This virtually prohibits the production of small boards in a fully automated process. Hence, manual fabrication of smaller boards is necessitated in an otherwise completely automated assembly line.

These problems have been overcome to some extent through the use of water jet cutters and laser cutting devices. Laser cutting devices, however, are only useful in cutting the fiberglass sheets prior to assembly in laminated sheets. Hence, laser cutters do not provide the capability of cutting loaded boards from a panel. Although water jet cutters are able to cut loaded printed circuit boards and are able to provide flexibility to the shape of the board to be cut from the panel, as well as reducing scrap in the cutting process, they are expensive to install and maintain. They are also dangerous to operate and require a large amount of floor space.

These problems have been overcome to some extent by the use of a shearing device which is capable of cutting the boards in a clean, quiet and rapid fashion with a device that does not require frequent blade replacement. Shearing devices also do not require preparation of the panels prior to depaneling as do routing devices. Shearing devices, in special circumstances, reduce the separation spacing of the individual printed circuit boards within the panel because of their ability to cut the boards at close intervals. However, shearing devices have generally not been employed in the cutting of printed circuit boards from panels because of the poor edge quality produced by the cut and safety considerations regarding shearing devices.

A patentability search was performed on the use of shears in manufacturing. The search produced the following art:

| Patent No. | Inventor | Date of Issue |
|---|---|---|
| 2,626,664 | Regele | Jan. 27, 1953 |

-continued

| Patent No. | Inventor | Date of Issue |
|---|---|---|
| 2,963,627 | Buchsbaum | Dec. 6, 1960 |
| 3,064,512 | Zurlo | Nov. 20, 1962 |
| 3,195,387 | Telfer | July 20, 1965 |
| 3,771,401 | Jasinski | Nov. 13, 1973 |
| 3,834,213 | Henzler et al. | Sept. 10, 1974 |
| 4,070,940 | McDaniel et al. | Jan. 31, 1978 |
| 4,309,696 | Nagai et al. | Jan. 5, 1982 |
| 4,312,618 | Greene | Jan. 26, 1982 |
| 4,466,766 | Geren, deceased et al. | Aug. 21, 1984 |
| Great Britain 1,579,020 | Pull | Nov. 12, 1980 |
| Germany 2,158,182 | Visomat-Gerate | May 30, 1973 |

McDaniel et al. discloses a shearing machine with a protective light curtain. Infrared light source 12 produces an infrared light beam which is reflected from corner reflector 46, across the front portion of the shearing machine and reflected back by a second corner reflector 51 to sensor unit 41. This produces a protective light curtain across the front of the machine such that insertion of any object as large as a finger will cause a reduction in voltage of the sensor unit 41, as illustrated in FIG. 3, to stop the cutting operation by opening switch 37. Column 4, lines 46+, disclose the operation of the protective light curtain. FIG. 2 also discloses a lower blade 28 which has a rectangular configuration which is secured to the inner edge of table 17 to interact with a beveled upper moveable blade 24.

The British Patent No. 1,579,020, the German Patent No. 2,158,182, Nagai et al. U.S. Pat. No. 4,309,696 and Buchsbaum Pat. No. 2,963,627, all relate to similar light ray safety devices.

The British patent relates to a device having multiple sensors and transmitters, i.e., sixteen light emitting diodes and receivers which produce an infrared light curtain. A sequencing of the sensors is used to obviate alignment problems.

The German patent discloses a device in which light is emitted from a common source and distributed by fiber optics or curved mirrors to produce a light safety curtain which is reflected back to received units. For example, FIG. 2 illustrates a light source 11 which projects a light beam which is focused by lens 12 and projected through a beam splitter 13 to a rotating square mirror 14 which distributes the beam of light progressively along curved mirror 15. A corner reflector 16 reflects the light back to curved mirror 15 and onto rotating reflector 14 to beam splitter 13 which reflects the return beam into lens 17 which focuses the return beam onto a single detector 18. Other methods are shown in FIGS. 1 and 3 using multiple light sources and multiple detector units.

Nagai et al. discloses a test circuit for detecting trouble in an optical security device using sequencing techniques.

Buchsbaum discloses an electronic guard device which uses an RF electromagnetic field rather than an optical frequency electromagentic field. As illustrated in FIGS. 5 and 6 and columns 7 and 8, a wiper arm 110 provides an electrical voltage which varies in accordance with the position of shaft 22. Potentiometer 111 produces a voltage which varies with the position of shaft 22. Transmitter circuit 29 produces an electrical field 103 which is detected by receiver and detector 101. As shaft 22 is inserted into the RF field 103, the voltage level is decreased at receiver and detector 101.

The voltage produced by control generator 105 and the voltage produced by receiver detector 101 is compared in DC amplifier 104 to determine if these voltages match. If any other object is inserted within the RF field, voltages will not match and indicator relay 91 will activate to disengage shaft 22.

Henzler et al., Geren and Greene, all disclose specialized automated devices for handling work pieces. Henzler et al. discloses a work piece translation mechanism for transferring work pieces through a stamping die.

Jasinski discloses a sheet metal shearing apparatus which utilizes a moving upper blade and a stationary lower blade. The upper blade is driven in a vertical direction by a piston rod 74 in a fluid operated cylinder 76 to produce a centralized force on blade 60. As illustrated in FIG. 4, blade 60 is held by side supports which appear to be made of bearing type material.

Regele, Zurlo, and Telfer all disclose moveable upper blades which interact with a replaceable lower blade. Zurlo discloses a stationary and removable lower blade 2 which interacts with a pointed shear blade 1 having an extremely pointed shear edge 6. Regele discloses an upper cutter bar 14 which utilizes a progressive shearing action, as illustrated in FIG. 1, which is used to prevent a single fracture so as to produce a cut edge rather than a fractured edge, as disclosed in column 3, lines 43 through 50. As diclosed in column 2, lines 13 through 18, the lower blade 11 is removable. Additionally, hollow edge 48, as illustrated in FIG. 5, is used to provide a sharp bevel to provide a clean cut. Telfer discloses a removable lower blade 38, as illustrated in FIG. 3, which interacts with moveable upper blade 31. The lower blade 38 has a rectangular configuration.

Currently available printed circuit board shearing devices suffer from many disadvantages and limitations therein. For example, the design of currently available shearing devices utilize a non-centered actuation system which results in the production of lever arm forces on the cutting blade resulting in inaccurate cuts. This, "out-of-line" design results in a machine which is large and bulky, expensive to build, difficult and expensive to maintain, requires frequent replacement of bearings resulting in inconvenient and expensive "down time" situations, and is incapable of providing sufficient rigidity to produce consistent, accurate cuts for extended periods.

Moreover, current designs of shearing devices for printed circuit boards utilize rear tooling, comprising tooling pins that are actuated to engage tooling holes in the printed circuit board which are normally located on scrap portions of the printed circuit board panels. The lower blade configuration confines the current shearing devices to rear tooling, i.e., tooling which is located behind the cutting blade, because of the design of the lower cutting blade of these conventional shearing devices. Conventional shearing devices use a horizontally disposed lower cutting blade which is attached to a lower blade holder in a horizontal orientation. This configuration does not provide room for tooling in front of the blade which is capable of engaging useable or interior portions of the printed circuit board panels. Panels cannot, therefore, be designed with zero spacing between the printed circuit boards. Rather, the panels must be designed with tooling holes in the border portions for locating the panels during the shearing process. Throughout the assembly line process locating tooling engages existing tooling holes on the interior portion of the panel. Consequently, conventionally designed shearing devices require specially drilled panels having tooling locating holes placed in custom designed border portions. This requires specially designed panels that are not needed for any other portion of the assembly line process.

Additionally, conventional shearing devices such as the shearing device produced by CENCORP, 4575 North Eleventh Street, Boulder, Colo. 80306 has a lip portion on the lower blade which is inherently weak. The lip portion is vertically displaced from the remainder of the horizontally oriented blade and provides some room for leads protruding beneath the panel in front of the blade near the cutting surface. The vertical displacement of the cutting portion of conventional lower blade devices provides minimal and normally inadequate clearance for component leads. Additional clearance cannot be provided because of the further weaknesses which would be caused by extending the cutting portion of the horizontally disposed blade in a vertical direction. Because of the inherent weaknesses of such a design, a minimal cross-sectional area of blade is required, which further restricts the spatial proximity which can be achieved between components mounted on the board and location of the cut because of the clearance needed for the leads of these components.

Currently available shearing devices also typically utilize archaic safety systems which include the use of a light curtain disposed in front of the cutting blade a considerable distance. Most shears are not designed for use with light curtains and these are noramlly added as a modification of the shear. Since the optical curtain is not aligned with the cutting blades, various errors can be made in detecting a potential obstruction since the optical detector is not actually detecting obstructions in the plane of movement of the cutting blade, but rather obstructions within a plane adjacent the plane of movement of the cutting blade. Additionally, such systems normally detect the integrated return of the optical curtain and make no attempt to determine the spatial location of the obstruction relative to the blade. This built-in "error factor" can also result in errors in detecting obstructions of the blade.

Consequently, conventional shearing devices have various disadvantages and limitations inherent in the design of these devices.

SUMMARY OF THE INVENTION

The present invention overcomes the disadvantages and limitations of the prior art by providing an improved printed circuit board shearing device. The present invention may comprise a shearing device for printed circuit boards including, an upper blade movable along a predetermined plane, a lower blade aligned with the upper blade to produce a shearing interface as the upper blade is moved along the predetermined plane, the lower blade oriented to provide maximum cross-sectional height in the direction of movement of the upper blade in the predetermined plane to maximize strength of the lower blade in the predetermined plane and minimize cross-sectional area of the lower blade in a plane orthogonal to the predetermined plane to provide clearance adjacent the lower blade in both the predetermined plane and the plane orthogonal to the predetermined plane to allow shearing of printed circuit boards containing components, front location tooling disposed in the clearance adjacent the lower blade to engage interior portions of the printed circuit boards to reduce scrap portions sheared from the printed circuit boards, and bearings disposed in the predetermined plane in alignment with the upper blade to maintain precise alignment of the upper blade with the lower blade as the upper blade is moved along the predetermined plane by preventing generation of lever arm forces between the upper blade and the bearings as a result of alignment of the bearings with the upper blade in the predetermined plane.

The advantages of the present invention are that it utilizes an in-line design wherein the bearings are aligned with the upper cutting blade so that lever arm forces are not produced between the movable upper blade and the bearings during the cutting process. This allows for precise alignment during the cutting process of the upper blade in the consistent and repeatable fashion. Additionally, the elimination of moment arm forces reduces wear on the bearings, increases the strength of the shearing device, reduces the overall size of the machine, provides for better rigidity and is a cheaper and easier machine to both build and maintain. Also, the hydraulic cylinder is aligned precisely with the upper blade resulting in greatly improved cut quality. The in-line design of the present invention allows for direct interchange of parts to reduce spare part inventory which further reduces capital expense.

The present invention also utilizes a vertically oriented lower blade which simultaneously increases the strength of the lower blade as well as providing clearance for zero space cutting of printed circuit boards having components mounted on both top and bottom portions thereof, as well as clearance for front tooling for locating the boards using existing tooling holes. The front tooling is designed to provide flexibility so that tooling cylinders can be easily relocated to engage tooling holes in any desired orientation with minimal effort. Also, rear tooling is provided which can be located with a high degree of flexibility and can be implemented to engage tooling holes or to function as stop pins for edge location.

The present invention also utilizes an optical curtain which is directly aligned with the movable upper blade so that an obstruction can be detected directly in the path of movement of the upper blade. Additionally, the present invention is capable of determining the location of an obstruction in comparing that location with the location of the blade to determine if movement of the upper blade should be halted. This greatly increases the reliability of the light curtain safety system of the present invention. Moreover, the restriction of the viewing angle of the optical detectors, as well as the restricted angle in which the optical beams are transmitted substantially eliminates the possibility of detection of a reflected signal or ambient light which could otherwise defeat the optical safety curtain. The position of the blade is provided by a highly accurate optical encoding device.

The present invention also utilizes microprocessor control to facilitate automation and to provide operator prompts to operate tooling and change minor operational parameters, as well as providing safety operational features. The microprocessor can be designed to operate the tooling so that a number of different board designs can be cut by actvating selected tooling cylinders. Additionally, the microprocessor is designed to interface directly with a general purpose robotics device and provide prompts to the robotics device for operation to both load and unload the shear. The present invention is designed to interface directly with existing automation equipment using the assembly line processes of fabrication of printed circuit boards and has a modular design to allow easy and inexpensive replacement of parts. The upper blade is designed with a rake and bevel which optimize shearing of the boards without breakage. The modular design of both the upper and lower blades allow easy and quick replacement, minimizing down time of the shear. The hydraulics drive unit is a two speed operational unit which can provide change between high power and fast operation during a single cutting operation.

DETAILED DESCRIPTION OF THE PREFERRED EMBODIMENT OF THE INVENTION

Figure 1:
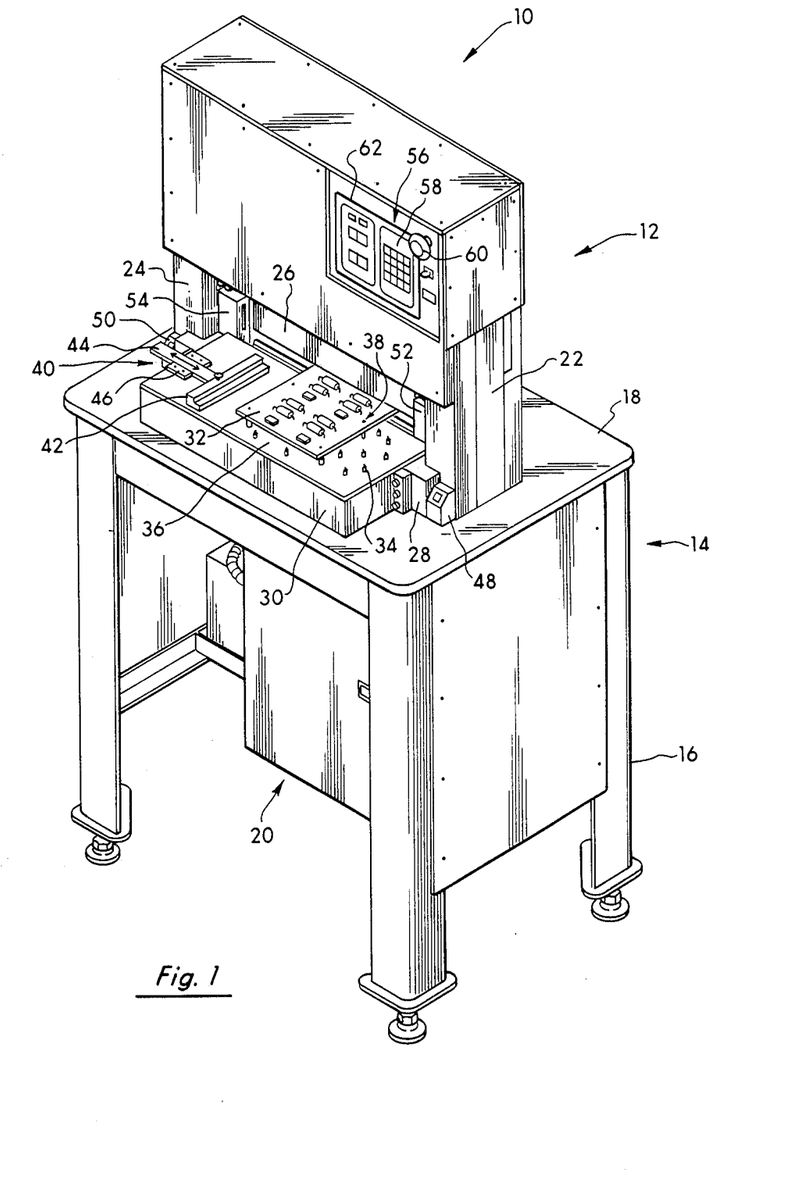
FIG. 1 is a front isometric view of the device of the present invention.

FIG. 1 is a isometric view illustrating the shearing device 10 of the present invention. Shearing device 10 comprises an upper portion 12 which is mounted on a lower table portion 14. Lower table portion 14 has a plurality of legs 16 which support a flat metal table top 18. Power supply circuitry, hydraulic pump mechanisms and other devices are located in enclosed portion 20 located under the table top 18.

Upper portion 12 includes two support arms 22, 24 which comprise the structural support for upper portion 12. Upper portion 12 houses an upper blade 26 which moves along a predetermined vertical plane. Support arms 22, 24 are securely attached to table top 18. Lower blade holder 28 is also directly coupled to table top 18. Front tooling box 30 is coupled directly to lower blade holder 28 so that movement of lower blade holder 28 causes simultaneous movement of front tooling box 30. Printed circuit board 32 is placed in the shear and supported by tooling pins 34 protruding from the upper plate 36 by a predetermined distance. Tooling pins 34 are selectively activated to engage tooling holes 38 in printed circuit board 32. Printed circuit board guide 40 is also located on the upper plate 36 of tooling box 30 which functions to support and to provide a lateral guide for locating printed circuit board 32 in the shear 10. Printed circuit board guide 40 comprises an edge guide 42, a slideable connector 44 and a slideable mounting plate 46.

Two actuation buttons 48, 50 can be used to manually operate the shear. Both buttons must be pressed simultaneously for actuation. Light curtain housings 52, 54 are aligned with upper blade 26 to produce a light curtain along the vertical plane of movement of upper blade 26. Control panel 56 includes a series of control buttons 58 for selecting tooling, an emergency stop button 60 in a display panel 62. Control panel 56 is more clearly shown in FIG. 13.

Figure 2:
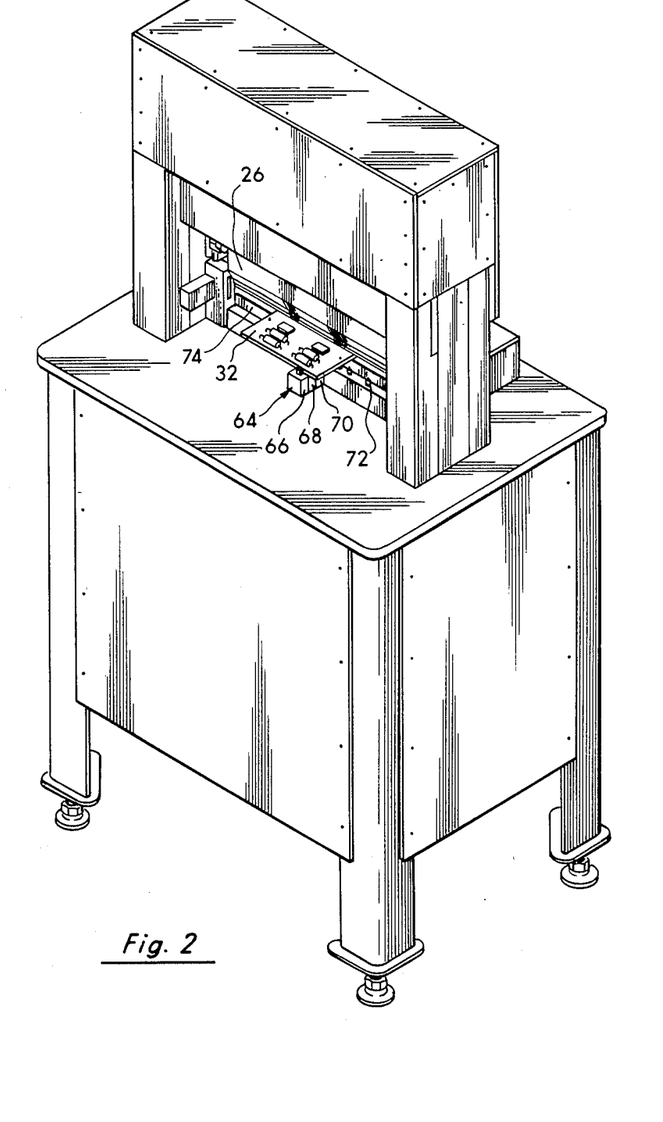
FIG. 2 is a rear isometric view of the device of the present invention.

FIG. 2 comprises an isometric rear view of the shearing device of the present invention. As illustrated in FIG. 2, printed circuit board 32 protrudes through the opening between the upper and lower blades and engages rear tooling 64. Rear tooling 64 comprises a stop-pin tooling device 66 and two spacer devices 68, 70. Other tooling pins 60, 72 are also located in the rear tooling to engage tooling holes located in board 32 or scrap in the panel.

Figure 3:
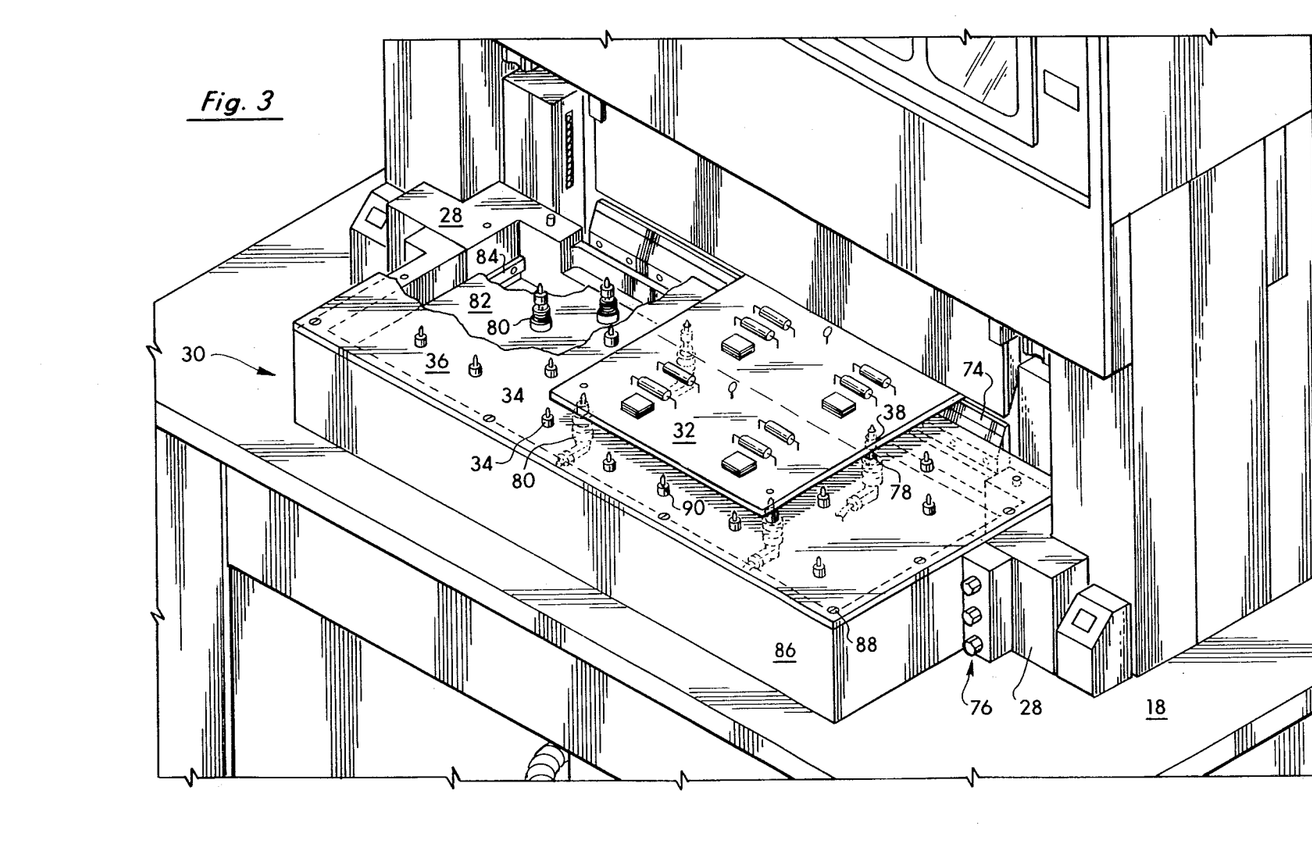
FIG. 3 is a front cut-away view of the front tooling box of the present invention.

FIG. 3 is a cut-away view of the front tooling box 30 of the present invention. Front tooling box 30 is connected to the lower blade holder 28 by way of connector 76. Upper plate 36 has a plurality of holes 78 for guiding each of the tooling pins 34. Each of the tooling pins is actuated by a pneumatic cylinder 80 which is mounted in a lower plate 82 comprising a portion of front tooling box 30. Lower plate 82 is connected to outside support 86 of lower front tooling box 30 by way of connecting bracket 84. Upper plate 36 is connected to support 86 by way of screw connectors 88.

The printed circuit board 32 is held with a predetermined vertical separation from upper plate 36 by way of tooling pins 34 which engage tooling holes 38 of printed circuit board 32. A shelf portion 90 on each of the tooling pins 34 supports the printed circuit board 32. The printed circuit board 32 is held in a plane which is substantially horizontally aligned with the upper edge of lower blade 74. Since the front tooling box 30 is connected to lower blade holder 28, adjustment of lower blade holder on table 18 causes the simultaneous adjustment of front tooling box 30. The clearance provided between printed circuit board 32 and upper plate 36 by engagement of tooling holes 38 by tooling pins 34 allow room for leads of components which are mounted on top of the printed circuit board 32, as well as components mounted on the bottom portion printed circuit board 32. In this manner, loaded printed circuit boards, as illustrated in FIG. 3 can be cut by the shearing device 10 of the present invention, including components which are mounted on both the top and bottom sides of the printed circuit board 32.

Figure 4:
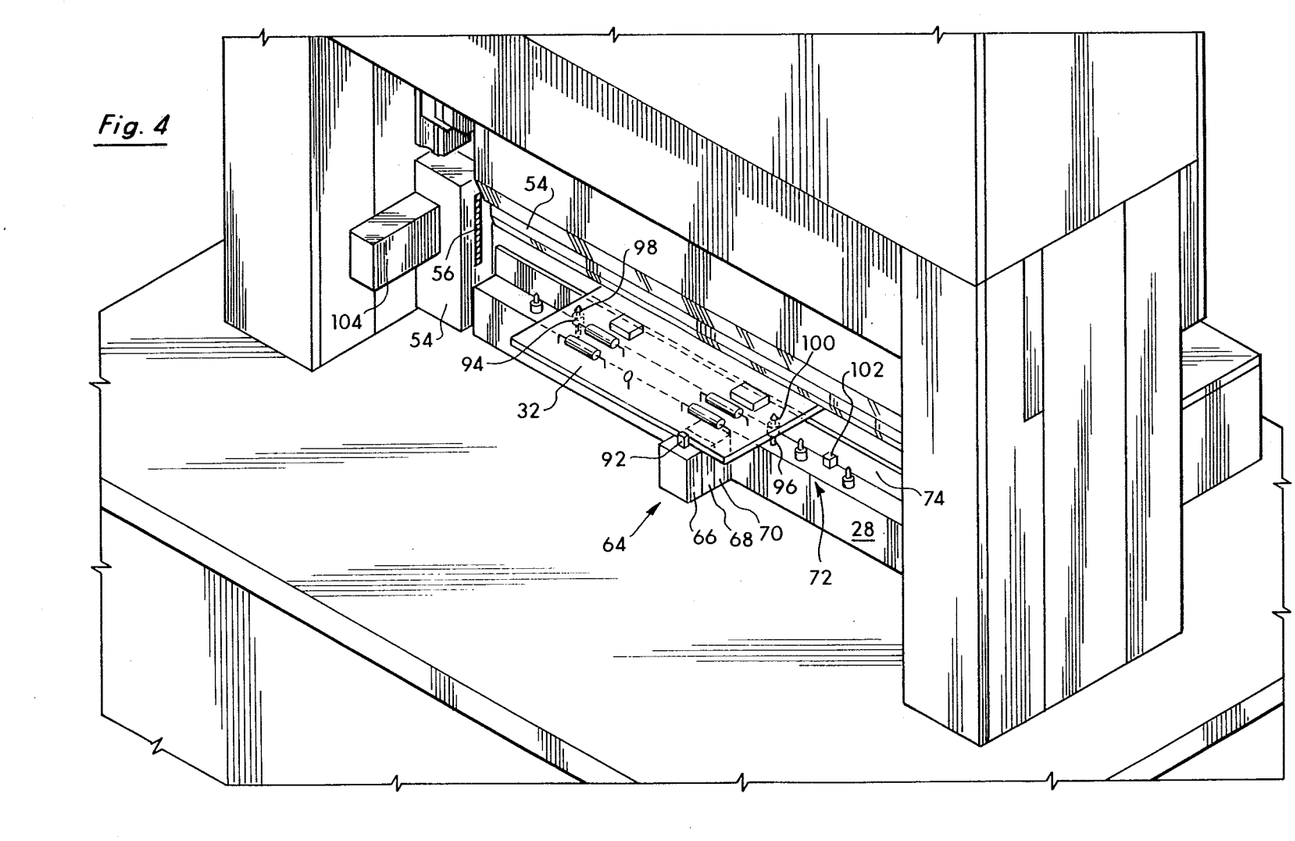
FIG. 4 illustrates the rear tooling of the present invention.

FIG. 4 schematically illustrates the manner in which rear tooling 64 is capable of engaging printed circuit board 32. As illustrated in FIG. 4, a stop pin 92 which can have either a square or a rectangular configuration is mounted in a rear tooling cylinder 66 for engaging printed circuit board 32 along a rear portion. Spacers 68, 70 allow the stop pin 92 to be located in a desired position. Spacers 68, 70 as well as rear tooling cylinder 66 are coupled to lower blade holder 28 so that movement of the lower blade holder causes a corresponding movement of the tooling. Tooling pin 72 can, likewise, be mounted directly in lower blade holder 28 as shown in FIG. 4. Tooling pins 94, 96 engage tooling holes 98, 100, respectively, in the printed circuit board 32, as illustrated. A rectangularly shaped stop pin 102 is mounted directly adjacent lower blade 74 to provide a stop for printed circuit board 32 directly adjacent to lower blade 74. Each of the tooling pins 72 mounted in the lower blade holder 28, such as tooling pins 94, 96 and 102, are separately actuated by pneumatic tooling cylinders mounted within lower blade holder 28. Consequently, selected tooling pins can be actuated to align various printed circuit boards 32. Although FIG. 4 illustrates location of printed circuit board 32 on a straight edge, stop pin 92 is capable of locating board 32 on a previously routed edge. Housing 54 has a plurality of apertures 56 to guide light in a light curtain which is aligned with upper blade 26. Electrical connections are made through housing 104.

Figure 5:
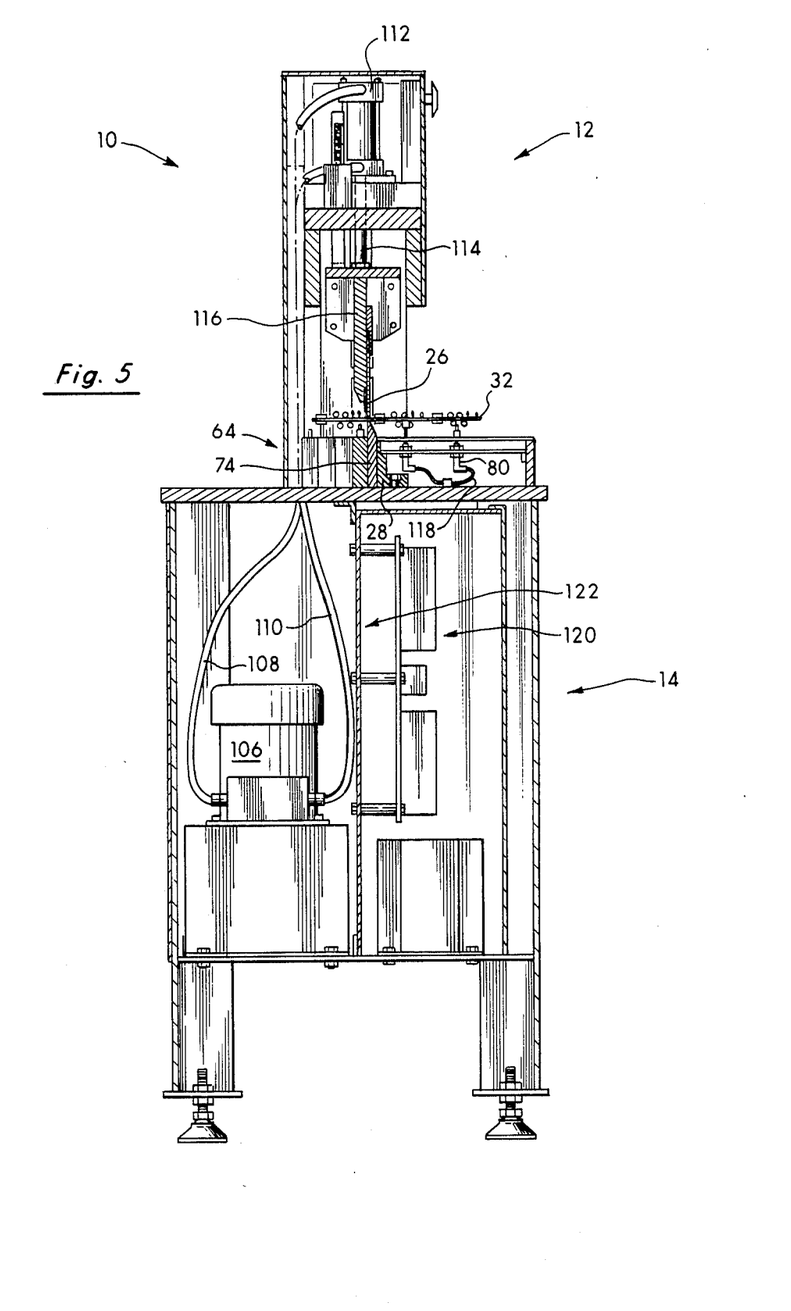
FIG. 5 is a cross-sectional elevation view of the present invention.

FIG. 5 is a schematic cross-sectional view of a shearing device of the present invention illustrating its in-line design and various design features. Hydraulic pump 106 is mounted in lower portion 14 and has hydraulic lines 108, 110 connected thereto for delivering hydraulic pressure to hydraulic cylinder 112. Upon application of pressure to hydraulic cylinder 112, shaft 114 is actuated to drive upper blade holder 116 in a downward direction such that upper blade 26 engages printed circuit board 32 for sharing. As is clearly shown in FIG. 5, hydraulic cylinder 112 shaft 114, upper blade holder 116 and upper blade 26 are all vertically aligned with lower blade 74 to insure a consistent and repeatable cut of the printed circuit board 32. The in-line design illustrated in FIG. 5 also allows precise placement of lower blade 74 so that high quality cut is made in printed circuit board 32. The consistency and repeatability of the cut which is performed results from the prevention of the generation of moment arm forces because of the in-line design. Since the forces are being applied directly in line with the cut which is being made, there is no chance for dislacement of the blade during cutting due to moment arm forces which would otherwise be generated by application of forces which were not aligned with the cut.

FIG. 5 also illustrates the manner in which the front and rear tooling provide sufficient clearance for both top and bottom mounted components. Pneumatic tooling cylinders 80 are selectively actuated by way of pneumatic lines 118 which are connected to a series of pneumatic control valves (not shown). The pneumatic control valves are controlled by a microprocessor of the present invention which functions to select the proper tooling for specific board designs. Power supply circuitry 120 and other circuitry of the present invention is mounted on a supporting structure 122, as illustrated in FIG. 5. FIG. 5 also illustrates the manner in which rear tooling 64 is mounted to the lower blade holder 28.

Figure 6:
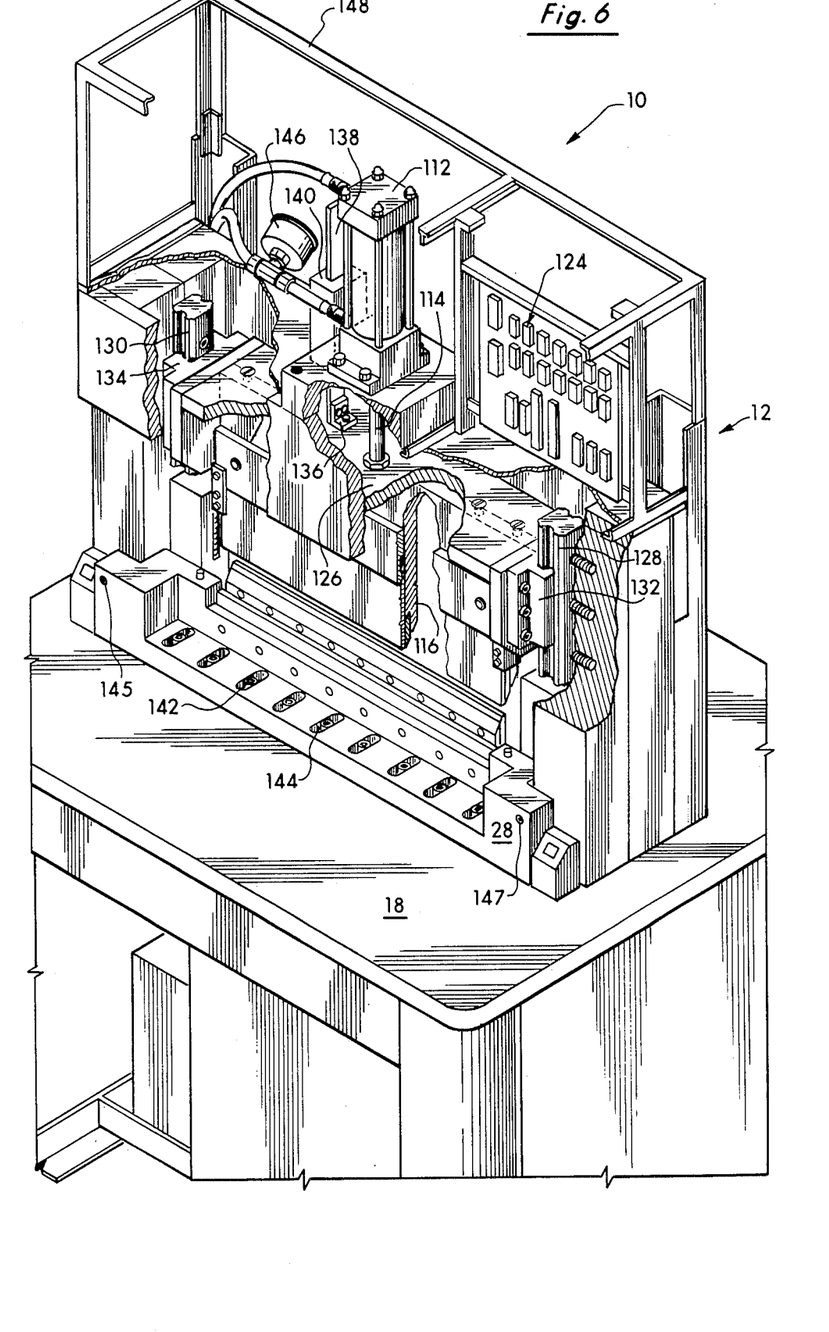
FIG. 6 is a cut-away isometric view of the device of the present invention.

FIG. 6 is a cut-away isometric view illustrating the upper portion 12 of the shear 10 of the present invention. A microprocessor 124 is mounted directly behind control panel 56. Microprocessor 124 functions to operate the front and rear tooling cylinders, as well as the hydraulic cylinder 112. Microprocessor 124 is programmed in a conventional manner through input keyboard 58 to select predetermined tooling cylinders to be actuated for different boards. Additionally, microprocessor 124 is capable of communicating by way of an RS232C serial port to interface with a general purpose robotics device to control actuation of the tooling pins and the upper blade. Shaft 114 is coupled directly to plate 126, which is in turn coupled directly to upper blade holder 116. Bearing rails 128, 130 are coupled to bearing guides 132, 134, respectively, and aligned directly with the predetermined vertical plane of movement of upper blade holder 116 to provide an in-line design which does not produce any moment arm forces during actuation. This greatly relieves stresses which are placed on the support bearings and thereby minimizes play which can be produced as a result of wear. Plate 126 has a bracket 136 which is coupled to an encoding plate 138 to cause encoding plate 138 to move in a vertical plane as upper plate 126 moves in response to actuation by shaft 14. Housing 140 contains optical transmitters and receivers to transmit optical radiation through the coded portions of encoding plate 138. An encoded output signal is indicative of the position of the upper blade. This information is communicated to microprocessor 124.

FIG. 6 also illustrates the manner in which lower blade holder 28 is coupled to table 18. Lower blade holder 128 has a series of slots 142 through which threaded connectors 144 couple the lower blade holder 128 to table 118. Slots 142 allow adjustment of the lower blade holder in a horizontal direction so that the lower blade can be precisely aligned with the upper blade. As disclosed above, the front and back tooling is connected directly to the lower blade holder so that further adjustment of the tooling is not required. The tooling is initially designed for placement relative to the cutting edge of the lower blade so that further adjustment of the tooling is not required upon movement of lower blade holder 28. A pressure gauge 146 is also provided in the hydraulic lines for indicating the pressure applied to hydraulic cylinder 112. Housing supports 148 support a decorative housing for the shear device 10. Set screws 145, 147 allow precise adjustment of the position of lower blade holder 116 relative to supports 24, 22, respectively.

Figure 7:
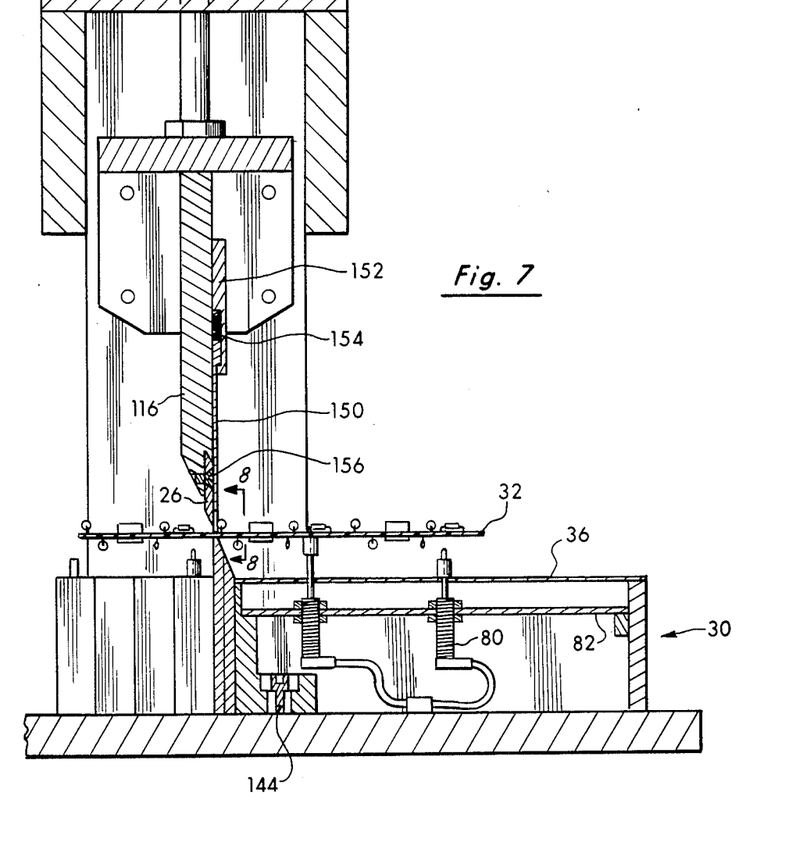
FIG. 7 is a cross-sectional elevation view illustrating the front and rear tooling of the present invention.

FIG. 7 further illustrates the manner in which the front and rear tooling engage printed circuit board 32, as well as illustrating the modular design of the upper blade means and the operation of the clamping plate. Clamping plate 150 is coupled to the upper blade holder 116 by way of guide 152. A spring 154 is disposed within guide 152 to apply a predetermined downward force on clamping plate 150. As the upper blade holder 116 moves vertically downwardly, clamping plate 150 engages the printed circuit board 32 prior to engagement by the upper blade 26. This includes a predetermined downward force on printed circuit board 32 to insure that printed circuit board 32 is securely held against the lower blade during the cutting process. Modular blade 26 is coupled to the upper blade holder 16 by way of threaded connector 156. Clamping plate 150 is sufficiently thin to allow a cut to be made on the printed circuit board 32 very close to components loaded on the board. For example, the clamping plate can have a thickness of approximately 0.0800. Modular blade means 26 has a predetermined rake to progressively cut the printed circuit board from the outer portions of the blade 26 towards the central portions of blade 26. Additionally, it has a predetermined bevel of approximately 25°, as illustrated in FIG. 7, which is capable of shearing the board without breakage and providing a high quality cut without excessive blade wear.

FIG. 7 also illustrates the manner in which tooling cylinders 80 are mounted in lower plate 82 of front tooling box 30. Printed circuit board manufacturers have the capability of locating the positions for tooling holes formed in printed circuit boards with a high degree of precision. Likewise, they are able to locate the position of the tooling and provide holes for mounting the tooling cylinders 80 with the same degree of accuracy. Similarly, guide holes in upper plate 36 are also capable of being formed with a high degree of accuracy. This allows for a great amount of flexibility in the operation of the shearing device of the present invention since upper plate 36 and lower plate 82 can be replaced with relative ease to accommodate various board designs. This degree of flexibility provided by the tooling of the present invention greatly reduces cost and downtime during change-over of fabrication projects.

Figure 8:
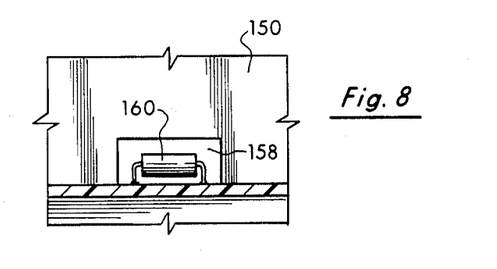
FIG. 8 is a view illustrating a notched portion of the clamping plate of the present invention.

FIG. 8 is a sectional view of the clamping plate 150 illustrated in FIG. 7. As shown in FIG. 8, a notched portion 158 is formed in clamping plate 150 to allow clearance for a component 160 which is mounted directly adjacent to the edge to be cut in printed circuit board 32. Since the clamping plate 150 can be replaced with relative ease this also provides a high degree of flexibility in allowing the shear 10 to make cuts with very close clearance to components.

Figure 9:
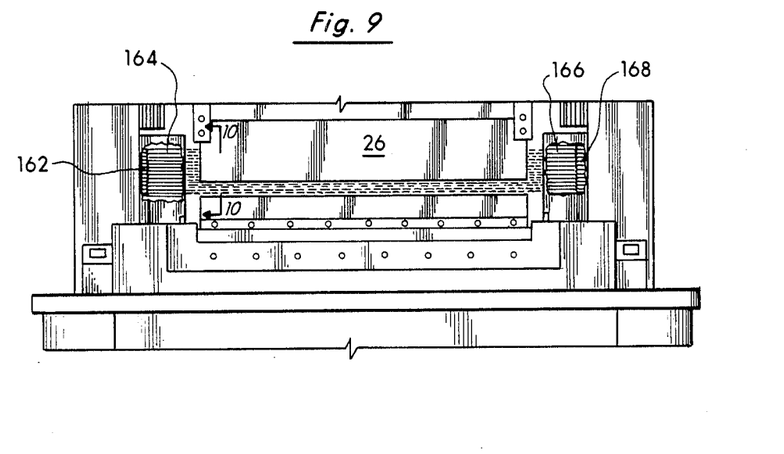
FIG. 9 is a front elevation view illustrating the light curtain of the present invention.

FIG. 9 is a front view of the shear illustrating the light curtain. Upper blade 26 is illustrated in a partially lowered position showing the manner in which it blocks propagation of the light beam. The light curtain is generated by a series of light emitting diodes 162, which can comprise laser diodes or other photon emitters. The light produced is transmitted through a series of channels 164 which are sufficiently long to restrict the angle of propagation of the beam. The beam is then transmitted across the opening and the shearing device between the upper blade and lower blade to produce a light curtain which is aligned with the cutting edges of the blades. The propagated beam is then transmitted through a plurality of reception channels 166 which are sufficiently long to restrict the viewing angle of light transmitted from light emitting diodes 162. The plurality of detectors 168 are aligned with channels 166 to produce an electrical signal indicative of the reception of light transmitted from light emitting diodes 162.

Figure 10:
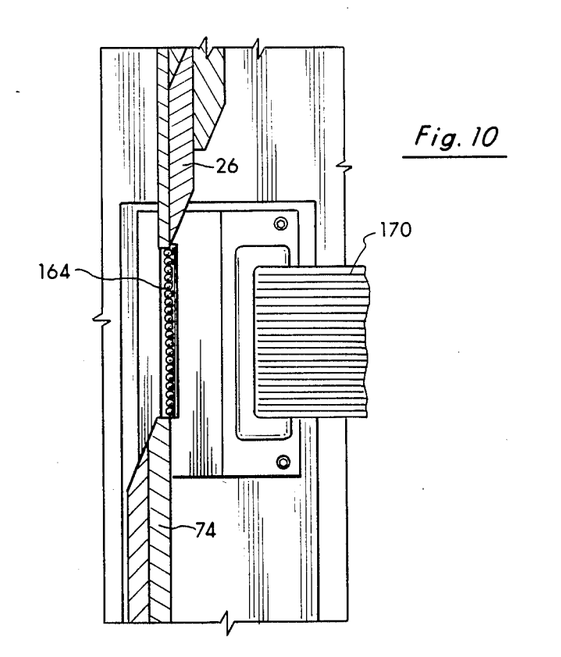
FIG. 10 is a side cross-sectional view illustrating the light curtain of the present invention.

FIG. 10 is a cross-sectional view schematically illustrating the alignment of channels 164 with upper blade means 26 and lower blade means 74. As illustrated in FIG. 10, channel 64 are precisely aligned with upper blade means 26 so that as upper blade means 26 is lowered the beams of the light curtain ae successively obstructed. Since each of the detectors 168 produces a separate output signal, an indication of the position of the obstruction of the light curtain can be precisely obtained from the output of detectors 168. This information is transmitted to the microprocessor 124 by way of a connector such as connector 170 coupled to detectors 168. Microprocessor 124 compares the signals produced by encoder 138, 140 (which are indicative of the actual position of the blade) with the obstruction data produced by the light curtain. If the two do not correspond, the shear is immediately haulted due to the indication of an obstruction in the cutting plane of the shear. In this manner, a precise indication can be obtained of the occurence of an obstruction in the cutting plane with a high degree of precision not previously available.

Figure 11:
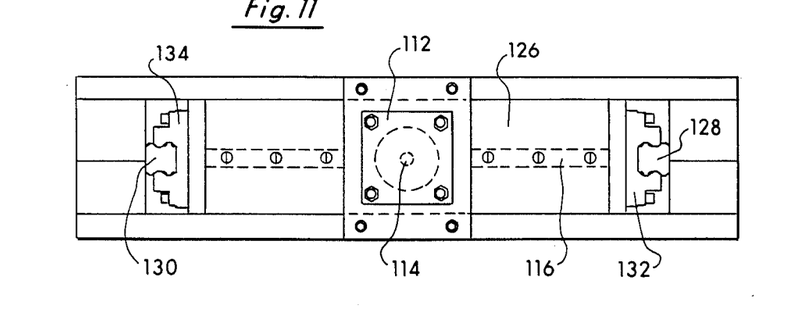
FIG. 11 is a top view illustrating the in-line design of the present invention.

FIG. 11 is a schematic top view illustrating the in-line orientation of the movable portions of the present invention. Bearing rails 128, 130, as well as bearing guide 132, 134, are precisely aligned with upper blade holder 116 mounted on plate 126. Additionally, shaft 114 of hydraulic cylinder 112 is precisely aligned in the predetermined vertical movement of upper blade holder 116. As indicated above, this eliminates the generation of moment arm forces and allows a consistent and repeatable cutting action of the shear.

Figures 12, 13:
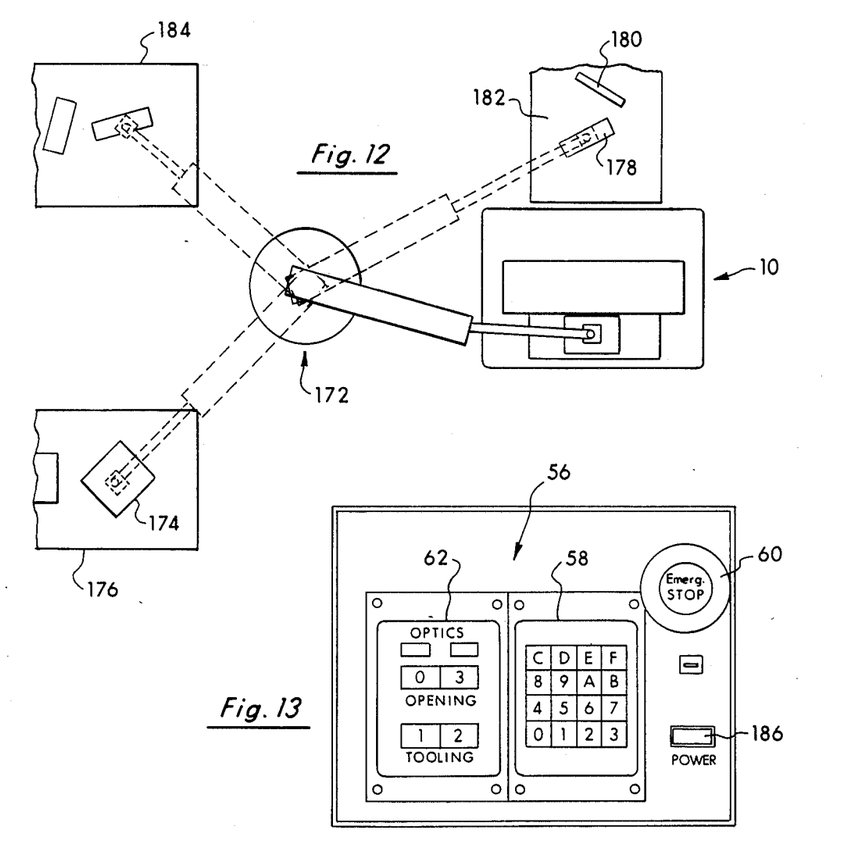
FIG. 12 is a top view illustrating the interfacing of a robotics device and the shear of the present invention.
FIG. 13 is a view of the control panel of the present invention.

FIG. 12 is a schematic top view of the shearing device 10 used in conjunction with a general purpose robotics device 172. As illustrated in FIG. 12, printed circuit board panels 174, which can comprise either loaded or bare panels, are removed from a supply conveyor 176 and placed on the shear 10 for shearing. The sheared portions 178 are separated from scrap portions 180 on scrap conveyor 182 and placed either on the shear 10 for additional shearing or on output conveyor 184. As indicated previously, the microprocessor of shear 10 communicates with the general purpose robotics device 172 by way of a serial communications port such as a RS232C communications port to interface movement of the general purpose robotics shear and actuation of tooling and the upper blade means of shear 10. Conventional programming techniques for interfacing these devices can be utilized.

FIG. 13 is a schematic illustration of the control panel 56 of the present invention. Control panel 56 includes a data entry keyboard 58 for entering data and selecting tooling configurations. Display panel 62 indicates the tooling configuration selected as well as the opening between the upper and lower blades. Additionally, an emergency stop button is provided to allow manual emergency stop of the shear. Power indicator 186 indicates whether or not the machine has been turned on.

Consequently, the shearing device 10 of the present invention comprises a greatly improved device for shearing printed circuit board material with minimal waste in a consistent and repeatable fashion. A great degree of flexibility is provided with the device of the present invention and it allows integration into the otherwise fully automated processes of forming printed circuit boards.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the present invention and its practical applications to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A shearing device for shearing printed circuit board disposed in a substantially horizontal plane comprising:

upper blade means movable along a predetermined substantially vertical plane;

lower blade means disposed in an orientation substantially parallel to said predetermined substantially vertical plane to provide clearance for components mounted on said printed circuit boards while maintaining blade strength of said lower blade means in the direction of movement of said upper blade means in said predetermined vertical plane;

location tooling means substantially horizontally displaced from said lower blade means and having tooling pins which are inserted through and engage holes located in said printed circuit boards and substantially horizontally displaced from said lower blade means to hold and support said printed circuit boards substantially horizontally during cutting on a supporting surface adjacent said tooling pins of said location tooling means so as to reduce scrap portions sheared from said printed circuit board;

lower blade holder means for structurally supporting said lower blade means in said orientation substantially parallel to said predetermined substantially vertical plane to provide sufficient clearance for components mounted on said printed circuit to allow substantially zero space cutting of said printed circuit boards adjacent said components mounted on said printed circuit boards;

means for precisely aligning forces applied to said upper blade means with said lower blade means during shearing and preventing generation of lever arm forces between said upper blade means and said bearing means.

2. A shearing device for shearing printed circuit boards comprising:

upper blade means movable along a predetermined plane;

lower blade means aligned with said upper blade means to produce a shearing interface as said upper blade means is moved along said predetermined plane, said lower blade means oriented to provide maximum height in the direction of movement of said upper blade means in said predetermined plane to maximize strength of said lower blade means in said predetermined plane and minimize cross-sectional area of said lower blade means in a plane orthogonal to said predetermined plane to provide clearance adjacent said lower blade means in both said predetermined plane and said plane orthogonal to said predetermined plane to allow shearing of said printed circuit boards disposed in said plane orthogonal to said predetermined plane which contain components;

location tooling means disposed in said clearance adjacent said lower blade means and having tooling pins which are inserted through and engage holes located in interior portions of said printed circuit board means to hold and support said printed circuit boards in said plane orthogonal to said predetermined plane during cutting on a supporting surface adjacent said tooling pins of said location tooling means so as to reduce scrap portions sheared from said printed circuit board means;

lower blade holder means for structurally supporting said lower blade means and said location tooling means, said lower blade holder means adjustably attached to said shearing device to allow said lower blade means and said location tooling means to be simultaneously aligned with said upper blade means;

means for maintaining precise alignment of forces applied to said upper blade means with said lower blade means as said upper blade means is moved along said predetermined plane and preventing generation of lever arm forces as a result of misalignment of said means for maintaining with said upper blade means in said predetermined plane;

microprocessor means for facilitating automation of said shearing device by controlling operation of said location tooling means in accordance with selected designs of said printed circuit board means.

3. A shearing device for printed circuit boards comprising:

upper blade means movable along a predetermined plane;

lower blade means aligned with said upper blade means to produce a shearing interface as said upper blade means is moved along said predetermined plane, said lower blade means oriented to provide maximum height in the direction of movement of said upper blade means in said predetermined plane to maximize strength of said lower blade means in said predetermined plane and minimize cross-sectional area of said lower blade means in a plane orthogonal to said predetermined plane to provide clearance adjacent to said lower blade means in both said predetermined plane and said plane orthogonal to said predetermined plane to allow shearing of said printed circuit boards which contain components;

front location tooling means disposed in said clearance adjacent said lower blade means to engage interior portions of said printed circuit board means to reduce scrap portion sheared from said printed circuit board means;

bearing means disposed in said predetermined plane in alignment with said upper blade means to maintain precise alignment of said upper blade means with said lower blade means as said upper blade means is moved along said predetermined plane by preventing generation of lever arm forces between said upper blade means and said bearing means as a result of alignment of said bearing means with said upper blade means in said predetermined plane;

optical transmitter means for transmitting a plurality of optical beams aligned with said upper blade means in said predetermined plane and substantially transverse to said direction of movement of said upper blade means such that said upper blade means progressively obstructs transmission of said plurality of optical beams;

optical detector means for producing an obstruction position signal indicative of the location of an obstruction of said optical beams, said optical detector means aligned with said upper blade means in said predetermined plane to receive said plurality of optical beams at reception angles sufficiently small to ensure detection of said optical beams in said predetermined plane;

optical encoding means for producing an upper blade position signal indicative of the position of said upper blade means as said upper blade means is moved in said predetermined plane;

control means for comparing said upper blade position signal and said obstruction position signal to produce a control signal to halt said movement of said upper blade means whenever said upper blade position signal and said obstruction position signal indicate that the position of said upper blade means differ from the position of an obstruction.

4. The shearing device of claim 3 further comprising:

lower blade holder means for structurally supporting said lower blade means and said front location tooling means, said lower blade holder means adjustably attached to said shearing device to allow said lower blade means and said front location tooling means to be simultaneously aligned with said upper blade means.

5. The shearing device of claim 4 further comprising:
rear location tooling means for engaging scrap portions of said printed circuit boards, said rear location tooling means attached to said lower blade holder means such that said rear location means is aligned simultaneously with said lower blade means and said front location tooling means.

6. The shearing device of claim 5 wherein said front location tooling means comprises:
tooling cylinder means for selectively engaging said printed circuit boards with tooling pins upon actuation;
lower plate means connected to said lower blade holder means for holding said tooling cylinder means in a preselected position relative to said lower blade means;
upper plate means connected to said lower blade holder means for providing locating holes for said tooling pins to precisely align said tooling pins with tooling holes with said printed circuit boards;
whereby said lower plate means and said upper plate means can be readily replaced to allow said tooling cylinder means to be aligned in any desired configuration to provide flexibility to modify said shearing device for a variety of applications.

7. The shearing device of claim 6 further comprising:
microprocessor means for facilitating automation of said shearing device by storing predetermined tooling hole configurations for a plurality of said printed circuit boards and operating said location tooling means to engage said predetermined tooling holes in accordance with a predetermined printed circuit board selected to be sheared so that a plurality of different panel designs can be sheared without modification of said shearing device.

8. The shearing device of claim 7 wherein said microprocessor means comprises:
cut order program function means for operating said location tooling means in accordance with a predetermined sequence corresponding to a predetermined order of cuts to be made in said printed circuit board means.

9. The shearing device of claim 8 wherein said microprocessor means comprises:
diagnostic and manual operation program function means for performing self-diagnostics on said shearing device and producing operator prompts to indicate functions to be performed by an operator.

10. The shearing device of claim 9 further comprising:
general purpose robotics means coupled to said microprocessor means for interacting with said microprocessor means to automatically control loading and unloading of said shearing device.

11. The shearing device of claim 7 further comprising:
hydraulic means aligned with said upper blade means for inducing movement of said upper blade means in said predetermined plane at high speeds and low powers to provide clearance for said printed circuit boards, and at low speeds and high powers to perform shearing operations of said printed circuit boards.

12. The shearing device of claim 11 wherein said lower blade means comprises:
modular lower blade means releasably coupled to said lower blade holder means for allowing quick and easy replacement of said modular lower blade means.

13. The shearing device of claim 11 wherein said upper blade means comprises:
modular upper blade means having sufficient rake and bevel to progressively shear said printed circuit boards without breakage of said boards;
upper blade holder means for releasably holding said modular upper blade means.

14. The shearing device of claim 13 further comprising:
clamping plate means coupled to said upper blade holder means for engaging said printed circuit boards prior to engagement of said upper blade means with said printed circuit boards to induce a predetermined force on said printed circuit boards to hold said printed circuit boards during shearing, said clamping plate having a cross-sectional thickness sufficiently small to allow shearing of boards containing components.

15. The shearing device of claim 14 wherein said clamping plate means is notched to provide clearance for components mounted adjacent a cut to be made in said printed circuit boards.

16. The shearing device of claim 14 wherein said optical transmitter means comprises a plurality of light emitting diodes which are recessed in plurality of optical channels to restrict the angle of propagation of radiation from said light emitting diodes.

17. The shearing device of claim 16 wherein said optical detector means comprises a plurality of photoconductors which are recessed in a plurality of optical channels which restrict reception of radiation propagated by said light emitting diodes to an area in said predetermined plane which comprises the area substantially encompassed by said upper blade means during movement in said predetermined plane.

18. The shearing device of claim 17 wherein said light emitting diodes comprise laser diodes.

19. The shearing device of claim 17 wherein said optical detector means further comprises:
filter means for filtering ambient radiation.

20. A shearing device for printed circuit boards comprising:
upper blade means having sufficient concavity and bevel to progressively shear said printed circuit boards without breakage of said boards;
hydraulic means aligned with said upper blade means for moving said upper blade means in a predetermined plane at high speed to provide clearance for movement of said printed circuit boards in said shearing device and for shearing said printed circuit board at a reduced speed with increased power;
bearing means disposed along said predetermined plane for precisely aligning said upper blade means by preventing generation of lever arm forces during said shearing;
lower blade means disposed in a vertical orientation along said predetermined plane to allow clearance for printed circuit boards having components mounted thereon and to provide increased strength along said predetermined plane during cutting;

lower blade holder means for holding said lower blade means in said vertical orientation along said predetermined plane and for mounting locating tooling in front of said lower blade shearing means to position said printed circuit boards on tooling holes located on interior portions of said printed circuit boards so as to reduce scrap portions cut from said printed circuit boards;

optical transmitter means for transmitting a plurality of optical beams transversely across said predetermined plane and in alignment with said upper blade means such that movement of said upper blade means by said hydraulic means causes said plurality of optical beams to be progressively blocked by said upper blade means;

optical detector means for producing an obstruction position signal indicative of the location of an obstruction of said upper blade means, said optical detector means disposed on said predetermined plane to receive said plurality of optical beams at reception angles sufficiently small to prevent detection of spurious radiation;

position detector means for producing an upper blade position signal indicative of the position of said upper blade means;

microprocessor means for facilitating automation of said shearing device by operating said locating tooling in accordance with selected designs of said printed circuit boards and for comparing said upper blade position signal and said obstruction position signal to halt movement of said upper blade means upon favorable comparison;

general purpose robotic means coupled to said microprocessor for automatically loading and unloading said printed circuit boards in said shear.

* * * * *